United States Patent
Kelly

(10) Patent No.: US 10,719,776 B1
(45) Date of Patent: Jul. 21, 2020

(54) QUANTUM BIT MULTI-STATE RESET

(71) Applicant: Google LLC, Mountain View, CA (US)

(72) Inventor: Julian Shaw Kelly, Santa Barbara, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/853,447

(22) Filed: Apr. 20, 2020

Related U.S. Application Data

(63) Continuation of application No. 16/465,341, filed as application No. PCT/US2016/065278 on Dec. 7, 2016, now Pat. No. 10,628,753.

(51) Int. Cl.
*G06N 10/00* (2019.01)
*H03K 3/38* (2006.01)

(52) U.S. Cl.
CPC ............. *G06N 10/00* (2019.01); *H03K 3/38* (2013.01)

(58) Field of Classification Search
CPC .................................. G06N 10/00; H03K 3/38
USPC ........................ 327/186, 366, 367, 527, 528
See application file for complete search history.

(56) References Cited

U.S. PATENT DOCUMENTS

| 7,082,419 | B1 | | 7/2006 | Lightowler | |
| 9,438,246 | B1 | * | 9/2016 | Naaman | H03K 19/195 |
| 10,217,057 | B2 | * | 2/2019 | Barends | F41J 9/02 |
| 10,422,607 | B2 | * | 9/2019 | Barends | H03K 3/38 |
| 2004/0077503 | A1 | * | 4/2004 | Blais | B82Y 10/00 505/190 |
| 2013/0009677 | A1 | * | 1/2013 | Naaman | G06N 10/00 327/113 |
| 2017/0206461 | A1 | * | 7/2017 | Friesen | G06F 15/82 |
| 2019/0229690 | A1 | * | 7/2019 | White | H03K 19/1954 |
| 2019/0303788 | A1 | * | 10/2019 | Kelly | G06N 10/00 |

FOREIGN PATENT DOCUMENTS

| EP | 0422348 | 4/1991 |
| TW | 201128542 | 8/2011 |
| TW | 201331855 | 8/2013 |

OTHER PUBLICATIONS

AU Office Action in Australian Application No. 2016432064 dated Feb. 12, 2020, 2 pages.
AU Office Action in Australian Application No. 2016432064 dated Mar. 10, 2020, 3 pages.
Hutchings et al, "Dephasing of superconducting asymmetric transom qubits," Syracuse University, Nov. 2015, 1 page.

(Continued)

*Primary Examiner* — Tomi Skibinski
(74) *Attorney, Agent, or Firm* — Fish & Richardson P.C.

(57) ABSTRACT

Apparatus and methods for resetting a qubit. In one aspect, an apparatus includes a qubit, wherein the qubit operates over a qubit frequency spectrum with a first flux-insensitive point and a second flux-insensitive point. The apparatus further includes a readout resonator, wherein the readout resonator operates at a readout resonator frequency in-between the first flux insensitive point and the second flux-insensitive point. The apparatus further includes a frequency controller that is configured to control the frequency of the qubit such that during a reset operation the frequency of the qubit is adjusted relative to the readout resonator frequency and the qubit is reset.

39 Claims, 7 Drawing Sheets

(56) References Cited

OTHER PUBLICATIONS

Jeffrey et al, "Supplementary information for Fast Accurate State Measurement with Superconducting Qubits," University of California, May 2014, 5 pages.
PCT International Search Report and Written Opinion in the International Appln. No. PCT/US2016/065278, dated Sep. 20, 2017, 15 pages.
Quintana et al, "Observation of classical-quantum crossover of 1/f flux noise and its paramagnetic temperature dependence," arXiv, Sep. 2016, 17 pages.
Strand et al, "Frist order sideband transitions with flux-driven asymmetric transmon qubits," arXiv, Jun. 2013, 5 pages.
TW Office Action in Taiwan Application No. 107113688, dated Jan. 14, 2020, 10 pages (with English translation).

* cited by examiner

QUANTUM BIT MULTI-STATE RESET

CROSS-REFERENCE TO RELATED APPLICATIONS

This application is a continuation application of, and claims priority to, U.S. patent application Ser. No. 16/465,341, now U.S. Pat. No. 10,628,753, titled "QUANTUM BIT MULTI-STATE RESET," filed on May 30, 2019, which application is a U.S. National Stage application of WIPO Patent Application No. PCT/US2016/065278, entitled "QUANTUM BIT MULTI-STATE RESET," filed Dec. 7, 2016. The disclosure of the foregoing applications incorporated herein by reference in their entirety for all purposes.

BACKGROUND

This specification relates to quantum computing.

Resetting a quantum bit is a task in quantum computing, as well as other applications.

SUMMARY

This specification describes technologies relating to quantum hardware and methods for resetting multiple qubit states using a readout resonator.

In general, one innovative aspect of the subject matter described in this specification can be embodied in an apparatus including a qubit, wherein the qubit operates over a qubit frequency spectrum with a first flux-insensitive point and a second flux-insensitive point; a readout resonator, wherein the readout resonator operates at a readout resonator frequency in-between the first flux insensitive point and the second flux-insensitive point; and a frequency controller configured to control the frequency of the qubit such that during a reset operation the frequency of the qubit is adjusted relative to the readout resonator frequency and the qubit is reset.

The foregoing and other implementations can each optionally include one or more of the following features, alone or in combination. In some implementations the frequency controller is further configured to control the frequency of the qubit such that during a computational operation the qubit operates at the first flux-insensitive point or the second flux-insensitive point.

In some implementations the qubit comprises an asymmetric superconducting quantum interference device (SQUID).

In some implementations the location of the first flux-insensitive point and the second flux-insensitive point in the qubit frequency spectrum depend on an asymmetry factor of the SQUID.

In some implementations the ratio of the frequency of the first flux-insensitive point to the frequency of the second flux-insensitive point depends on the asymmetry factor of the SQUID.

In some implementations the asymmetry factor of the SQUID is given by $$A = \frac{1+R^2}{1-R^2}, R = \frac{\sqrt{A-1}}{\sqrt{A+1}}$$

where A represents the asymmetry factor, R represents the ratio of the frequency of the first flux-insensitive point to the frequency of the second flux-insensitive point and A>1, R<1.

In some implementations, to adjust the qubit frequency relative to the readout resonator frequency, the frequency controller is configured to set the qubit frequency at or near the resonator frequency.

In some implementations during a reset operation the frequency controller is configured to apply adiabatic swapping to adjust the frequency of the qubit relative to the readout resonator frequency.

In some implementations the first flux-insensitive point is lower than the second flux-insensitive point, and wherein during a computational operation the qubit operates at the lower flux-insensitive point.

In some implementations the readout resonator frequency is at least a predetermined distance away from both the first flux-insensitive point and the second flux-insensitive point.

In some implementations the qubit is an Xmon qubit.

In some implementations the readout resonator operates at about 6.65 GHz.

In some implementations the first flux-insensitive point is at about 4.5 GHz and the second flux-insensitive point is at about 7.2 GHz.

Another innovative aspect of the subject matter described in this specification can be embodied in an apparatus including a qubit, wherein the qubit operates at a qubit frequency over a qubit frequency spectrum; a readout resonator, wherein the readout resonator operates at a readout resonator frequency below the qubit frequency; and a frequency controller configured to control the frequency of the qubit such that during a reset operation the frequency of the qubit is adjusted relative to the readout resonator frequency and the qubit is reset.

The foregoing and other implementations can each optionally include one or more of the following features, alone or in combination. In some implementations the apparatus further comprises a Purcell filter, wherein the Purcell filter is centered around a Purcell filter frequency.

In some implementations the Purcell filter frequency is lower than the qubit operating frequency.

In some implementations the Purcell filter frequency is about 4.5 GHz.

In some implementations the qubit frequency spectrum comprises frequencies between about 4.5 and 6.5 GHz.

In some implementations the readout resonator operates at about 1 GHz below the qubit operating frequency.

In some implementations the qubit comprises a superconducting qubit.

In some implementations, to adjust the qubit frequency relative to the readout resonator frequency, the frequency controller is configured to set the qubit frequency at or near the resonator frequency.

In some implementations during a reset operation the frequency controller is configured to apply adiabatic swapping to adjust the frequency of the qubit relative to the readout resonator frequency such that the qubit is reset.

The subject matter described in this specification can be implemented in particular embodiments so as to realize one or more of the following advantages.

In order to implement qubit reset, the frequency at which a qubit operates may be put on or near a frequency at which a corresponding readout resonator operates. Unlike measurement and gate feedback methods, by putting the qubit frequency at or near the resonator frequency all qubit states may be reset simultaneously. Furthermore, putting the qubit frequency at or near the resonator frequency does not require any feedback mechanisms and, unlike reset methods based on quantum gates, does not propagate qubit leakage to higher states.

In systems that include superconducting qubits realized by symmetric superconducting quantum interference devices (SQUIDs), the highest frequency in which the qubit operates is at a flux-insensitive point. The flux-insensitive point is a region in the frequency spectrum of the qubit that is used as a resource for dephasing. A significant source of dephasing is flux noise. Flux noise "jitters" the qubit frequency (by an amount that is dependent on the qubit's sensitivity to flux noise), inducing dephasing. Qubit sensitivity to flux noise decreases until it reaches a minimum at the flux-insensitive point. Therefore, if the flux-insensitive point is placed above a corresponding frequency at which a readout resonator operates, the qubit may have to be biased far below the flux-insensitive point. Biasing the qubit far below the flux-insensitive point can result in the qubit becoming very flux-sensitive and producing poor dephasing times.

Alternatively, if the frequency at which the readout resonator operates is placed below the flux-insensitive point, additional considerations may have to be taken into account. For example, the thermal photon population of the resonator may be higher compared to systems where the frequency at which the readout resonator operates is not below the flux-insensitive point—incurring dephasing. Finally, allowing the readout resonator to operate at a standard frequency and increasing the frequency at which the qubit operates, e.g., to 7-10 GHz, results in a system that is impractical or even infeasible to engineer.

A system implementing quantum bit multi-state reset using an asymmetric SQUID junction, as described in this specification, implements the asymmetric SQUID junction scheme to include a second flux-insensitive point below the frequency at which the readout resonator operates. The system is able to achieve fast reset of qubit states, an increase in the associated data rate, e.g., over one hundred fold, little to no degradation in dephasing and is forward compatible to data qubit reset, e.g., using adiabatic swap. For example, other systems that do not perform quantum bit multi-state reset perform a control sequence that involves an algorithm or computation and state reset. The algorithm can typically take a few microseconds, and resetting the qubit state reliably without active reset requires waiting significantly longer than the coherence time, e.g., five times the coherence time. A system implementing quantum bit multi-state reset avoids these problems.

A system implementing quantum bit multi-state reset using a low readout resonator frequency, as described in this specification, implements a scheme in which the frequency at which the readout resonator operates is lower than the qubit operating frequency. Typically, operating a qubit at a frequency that is higher than a frequency at which the readout resonator operates can cause the qubit to couple to higher modes of the readout resonator. This in turn can cause increased T1 energy relaxation. A system implementing quantum bit multi-state reset using a low readout resonator frequency, as described in this specification, enables the qubit to be operated at a frequency above the readout resonator frequency with similar protection from the environment as that when operating the qubit at a frequency below the readout resonator frequency.

Systems implementing quantum bit multi-state reset, as described in this specification, may be used to perform fault tolerant error correction in quantum computations to prevent correlated errors, thus improving the accuracy and reliability of said quantum computations and systems performing said quantum computations.

Systems implementing quantum bit multi-state reset, as described in this specification, enable qubits involved in a computation to be reliably recycled during the computation. For example, in systems that do not implement quantum bit multi-state reset as described in this specification, an ancilla qubit is typically discarded. However, in the systems described in this specification, an ancilla qubit can be initialized and used again in the computation. Furthermore, unlike other systems, qubit recycling is not dependent on measurement fidelity and feedback time.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This specification describes an architecture and method for resetting multiple states of a qubit. In some cases the architecture includes a qubit realized by an asymmetric superconducting quantum interference device (SQUID) that provides two flux-insensitive points of the qubit frequency spectrum and a readout resonator that operates at a frequency in-between the two flux-insensitive points. In other cases the architecture includes a qubit realized by a SQUID and a readout resonator that operates at a frequency that is lower than the qubit operating frequency. In both cases qubit reset is achieved by putting the qubit at or near resonance with the readout resonator.

Example Operating Environment

Figure 1A:
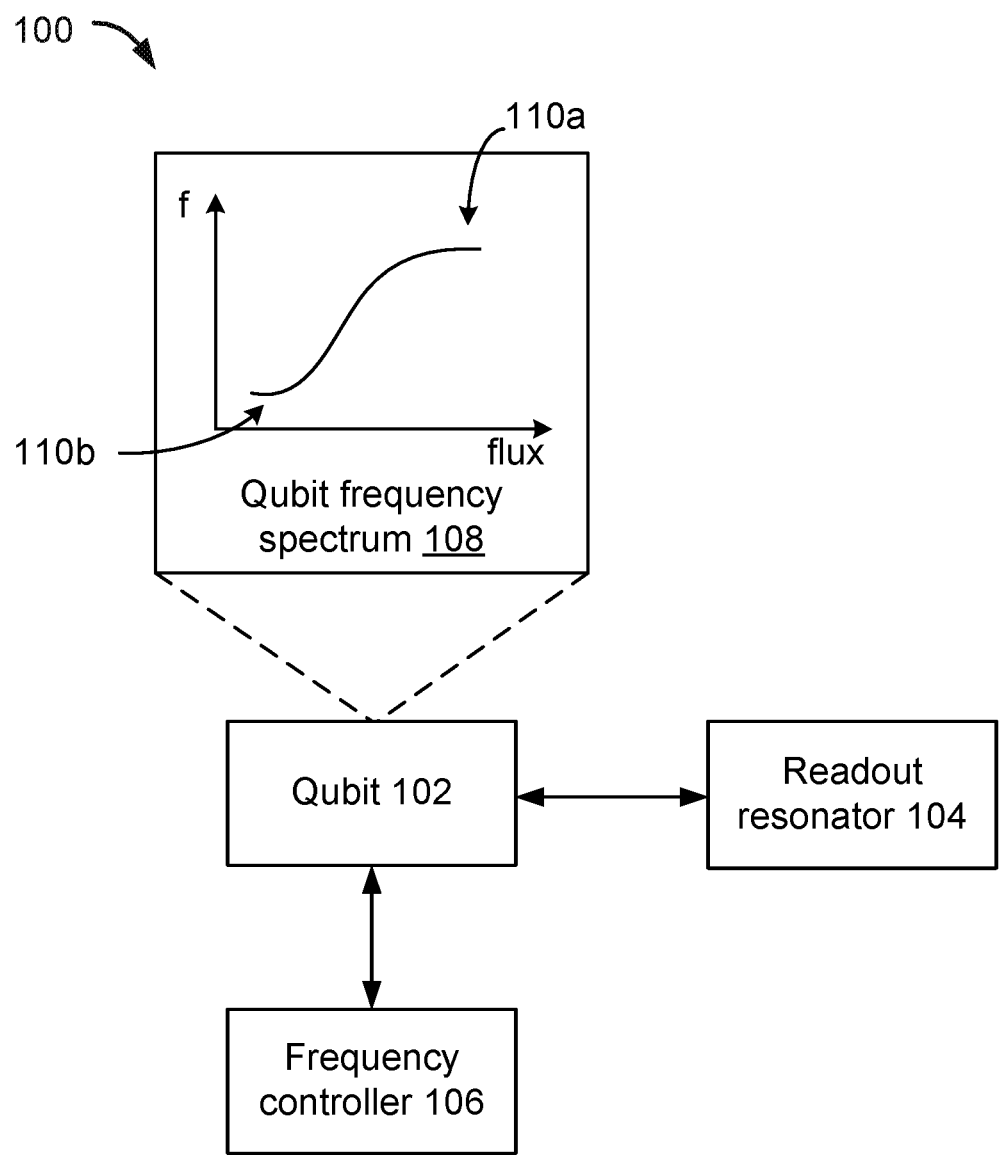
FIG. 1A depicts an example system for performing quantum bit multi-state reset using an asymmetric squid.

FIG. 1A depicts an example system 100 for performing qubit multi-state reset. The system 100 includes a qubit 102, a readout resonator 104 and a frequency controller 106. The readout resonator 104 and frequency controller 106 interact with the qubit 102. For convenience one qubit 102 and one readout resonator are shown in FIG. 1A, however in some implementations the system 100 may include multiple qubits and multiple readout resonators.

In some implementations the qubit 102 may be a superconducting qubit, e.g., an Xmon qubit. For example, the qubit 102 may be realized by a superconducting quantum interference device (SQUID). The qubit 102 includes a set of qubit levels, e.g., two computational qubit levels 0-, 1- and one or more non-computational levels that are each higher than the computational qubit levels. Transitions between the qubit levels, e.g., transitions from level 0- to 1-, 1- to 2-, 2- to 3-, etc., may be associated with respective transition frequencies. The computational qubit levels 0- and 1- are qubit levels used to perform computational operations, as described below. Operating a qubit at a particular frequency may therefore describe facilitating a transition between the computational qubit levels using the particular frequency, e.g., using a microwave pulse to induce a transition from 0- to 1- or from 1- to 0-. The range of frequencies that may be used to operate a qubit may be said to form a frequency spectrum.

The qubit 102 may be frequency tunable, i.e., the frequency inducing a transition between computational qubit levels may be controllable. As described above, in some implementations the qubit 102 may be a superconducting qubit and realized by a SQUID. In these implementations the frequency of the qubit 102 may be tunable via tuning a current that flows through the SQUID, e.g., by applying an external magnetic flux to the SQUID. In some implementations the dependency of the qubit frequency on a tunable current may be given by a square-root of cosine.

The frequency spectrum of a qubit may include one or more flux-insensitive points. A flux-insensitive point is a point or region in the frequency spectrum where a qubit may operate at or over without being sensitive to changes in the current used to tune the frequency of the qubit, e.g., to first order. The frequency spectrum 108 of qubit 102 includes multiple flux-insensitive points, e.g., flux-insensitive point 110a and flux-insensitive point 110b. In some implementations the first flux-insensitive point 110a may correspond to a frequency of about 4.5 GHz. In some implementations the second flux-insensitive point 110b may correspond to a frequency of about 7.2 GHz. Example flux-insensitive points are illustrated below with reference to FIG. 2.

As described above, in some implementations the qubit 102 may be realized by a SQUID. In these implementations the SQUID may be an asymmetric SQUID. An asymmetric SQUID includes two Josephson junctions in parallel in a superconducting loop. A current I enters the SQUID and splits into two paths with respective junction critical currents $I_1$ and $I_2$. An asymmetric SQUID is a SQUID whose respective junction critical currents $I_1$ and $I_2$ are not equal, namely $I_1 \neq I_2$.

The location of the flux-insensitive points of the qubit frequency spectrum 108, e.g., flux-insensitive point 110a and flux-insensitive point 110b, may depend on an asymmetry factor of the asymmetric SQUID. For example, given a SQUID with junction critical currents $I_1$ and $I_2$, a corresponding critical current $I_C^{SQUID}$ may be derived as a function of applied magnetic flux $\Phi$. As a first step, $I_C^{SQUID}$ may be determined using the below equations:

$$\phi_{12}(a) = \phi_a - \frac{2e}{\hbar} \int_{path\,a} \vec{A} \cdot \vec{ds}$$

$$\phi_{12}(b) = \phi_b - \frac{2e}{\hbar} \int_{path\,b} \vec{A} \cdot \vec{ds}$$

$$\phi_{12}(a) = \phi_{12}(b)$$

$$\phi_a - \phi_b = -\frac{2e}{\hbar} \oint_{SQUID} \vec{A} \cdot \vec{ds} = -\frac{2e}{\hbar} \int_{surface} \vec{B} \cdot \vec{dA} = -\frac{2e}{\hbar}\Phi = -\frac{2\pi\Phi}{\Phi_0}.$$

Defining $$\phi_{avg} = \frac{\phi_a + \phi_b}{2}$$

gives $$\phi_a = \phi_{avg} - \frac{e}{\hbar}\Phi, \phi_b = \phi_{avg} + \frac{e}{\hbar}\Phi \text{ and}$$

$$I_C^{SQUID} = I_1 \sin\left(\phi_{avg} - \frac{\pi\Phi}{\Phi_0}\right) + I_2 \sin\left(\phi_{avg} + \frac{\pi\Phi}{\Phi_0}\right).$$

For an asymmetric SQUID, the above may be solved for two regions of interest, namely the flux-insensitive points, e.g., flux insensitive points 110a and 110b. The points may lie at $\Phi/\Phi_0 = 0, \frac{1}{2}$.

When $\Phi/\Phi\Phi_0 = 0$, the critical current $I_C^{SQUID}$ may be given by $$I_C^{SQUID} = I_1 + I_2.$$

When $\Phi/\Phi\Phi_0 = \frac{1}{2}$, the critical current $I_C^{SQUID}$ may be given by $$I_C^{SQUID} = I_1 \cos(\phi_{avg}) + I_2 \cos(\phi_{avg})$$

$$I_C^{SQUID} = |I_1 - I_2|.$$

In some implementations, a ratio R of the frequency of the first flux-insensitive point, e.g., flux-insensitive point 110a, to the frequency of the second flux-insensitive point, e.g., flux insensitive point 110b, may be engineered to depend on the asymmetry factor of the SQUID, as given below in equation (1).

$$R = \frac{f_{min}}{f_{max}} = \frac{\sqrt{|I_1 - I_2|}}{\sqrt{I_1 + I_2}} \tag{1}$$

In equation (1), $f_{min}$ represents the frequency of the first flux-insensitive point and $f_{max}$ represents the frequency of the second flux-insensitive point and it is assumed that the frequency at which the qubit operates is proportional to the square root of the critical current.

In some implementations the asymmetry factor A of the SQUID may be given by equation (2) below.

$$A = \frac{1 + R^2}{1 - R^2}, R = \frac{\sqrt{A-1}}{\sqrt{A+1}} \tag{2}$$

In equation (2), A represents the asymmetry factor, R represents the ratio of the frequency of the first flux-insensitive point to the frequency of the second flux-insensitive point and it is assumed that A>1, R<1, and $I_1 > I_2$.

As described above, in some implementations the qubit 102 may be engineered such that the first flux-insensitive point 110a is located at a 4.5 GHz and the second flux-insensitive point 110b is located at 7.2 GHz. Using equation (1), the ratio R of the frequency of the first flux-insensitive point to the frequency of the second flux-insensitive point equals R=0.625. Using equation (2), the asymmetry factor A of the SQUID equals A=2.28. Example flux-insensitive points for a SQUID with asymmetry factor A=2.28 are shown below with reference to FIG. 2.

The qubit 102 may be used to perform computational operations, e.g., algorithmic operations or quantum computations. During a computational operation, the qubit 102 operates at a frequency corresponding to a flux-insensitive point. For example, in some implementations the qubit 102 may operate at the flux-insensitive point corresponding to the lowest frequency, e.g., flux-insensitive point 110a.

The qubit 102 may undergo a reset operation, e.g., an operation that restores the qubit 102 to its ground state. During a reset operation, the qubit 102 operates at a frequency corresponding to the frequency at which the readout resonator operates. In some implementations operating the qubit 102 at a frequency at which the readout resonator operates includes sweeping the frequency at which the qubit operates past the frequency at which the readout resonator operates to perform downward qubit level transitions, i.e., performing multi-state qubit reset. Performing a qubit reset operation is described in more detail below with reference to FIG. 5.

The readout resonator 104 operates at a readout resonator frequency. In some implementations the readout resonator frequency is a frequency that lies between the frequencies corresponding to the flux-insensitive points 110a and 110b. For example, as described above, in some implementations the first flux-insensitive point 110a may correspond to a frequency of about 4.5 GHz and the second flux-insensitive point 110b may correspond to a frequency of about 7.2 GHz. In this example, the readout resonator may operate at a readout resonator frequency of about 6.65 GHz. In some implementations the readout resonator frequency may be at least a predetermined distance away from both the first flux-insensitive point 110a and the second flux-insensitive point 110b so that unwanted qubit reset does not occur during a computational operation.

The frequency controller 106 is configured to control the frequency of the qubit 102. The frequency controller 106 controls the frequency of the qubit 102 such that during a reset operation the frequency of the qubit may be adjusted relative to the readout resonator frequency in order to facilitate qubit reset. For example, the frequency controller 106 may be configured to put the frequency at which the qubit 102 operates at or near the resonator frequency. In some implementations the frequency controller may apply adiabatic swapping to adjust the frequency at which the qubit 102 operates relative to the frequency at which the readout resonator 104 operates in order to facilitate qubit reset. Performing qubit multi-state reset using a frequency controller is described in more detail below with reference to FIGS. 4 and 5.

Figure 1B:
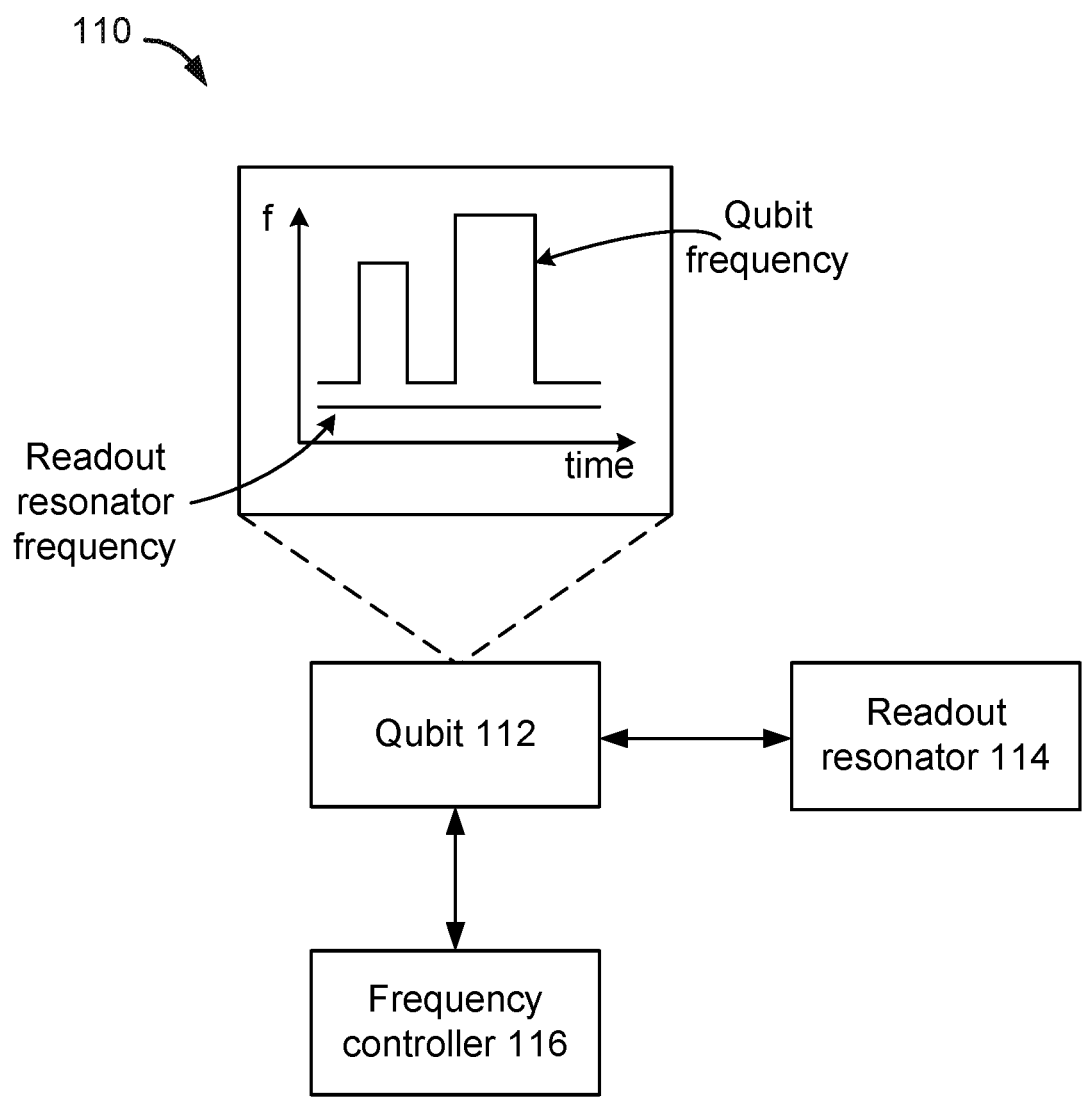
FIG. 1B depicts an example system for performing quantum bit multi-state reset using a low frequency readout resonator.

FIG. 1B depicts an example system 110 for performing quantum bit multi-state reset using a low frequency readout resonator. The system 110 includes a qubit 112, a readout resonator 114 and a frequency controller 116. The readout resonator 114 and the frequency controller 116 interact with the qubit 112. For example, the readout resonator 114 and qubit 112 may interact through a capacitive coupling. For convenience one qubit 112 and one readout resonator 114 are shown in FIG. 1B, however in some implementations the system 110 may include multiple qubits and multiple readout resonators.

In some implementations the qubit 112 may be a superconducting qubit, e.g., an Xmon qubit. For example, the qubit 112 may be realized by a superconducting quantum interference device (SQUID). The qubit 112 includes a set of qubit levels, e.g., two computational qubit levels 0-, 1- and one or more non-computational levels that are each higher than the computational qubit levels. Transitions between the qubit levels, e.g., transitions from level 0- to 1-, 1- to 2-, 2- to 3-, etc., may be associated with respective transition frequencies.

The computational qubit levels 0- and 1- are qubit levels used to perform computational operations, e.g., algorithmic operations or quantum computations. Operating a qubit at a particular frequency may describe facilitating a transition between the computational qubit levels using the particular frequency, e.g., using a microwave pulse to induce a transition from 0- to 1- or from 1- to 0-. The range of frequencies that may be used to operate a qubit may be said to form a frequency spectrum. In some implementations the qubit frequency spectrum includes frequencies between about 4.5 GHz and 6.5 GHz.

The qubit 112 may also undergo a reset operation, e.g., an operation that restores the qubit 112 to its ground state. During a reset operation, the qubit 112 operates at a frequency corresponding to the frequency at which the readout resonator operates. In some implementations operating the qubit 112 at a frequency at which the readout resonator operates includes sweeping the frequency at which the qubit operates past the frequency at which the readout resonator operates to perform downward qubit level transitions, i.e., performing multi-state qubit reset. Performing a qubit reset operation is described in more detail below with reference to FIG. 6.

The qubit 112 may be frequency tunable, i.e., the frequency inducing a transition between computational qubit levels may be controllable. As described above, in some implementations the qubit 112 may be a superconducting qubit and realized by a SQUID. In these implementations the frequency of the qubit 112 may be tunable via tuning a current that flows through the SQUID, e.g., by applying an external magnetic flux to the SQUID. In some implementations the dependency of the qubit frequency on a tunable current may be given by a square-root of cosine.

The readout resonator 114 operates at a readout resonator frequency. In some implementations the readout resonator frequency is a frequency that is below the qubit operating frequency. For example, the readout resonator may operate at a readout resonator frequency that is about 1 GHz below the qubit operating frequency. In some implementations the readout resonator may operate at 4.5 GHz.

Optionally, the system 110 may include a Purcell filter. The Purcell filter may be coupled to the readout resonator 114, e.g., through an inductive coupling realized via a voltage tap. The Purcell filter may be centered around a Purcell filter frequency. In some implementations the Purcell filter frequency may also be below the qubit operating frequency.

The frequency controller 116 is configured to control the frequency of the qubit 112. The frequency controller 116 controls the frequency of the qubit 112 such that during a reset operation the frequency of the qubit may be adjusted relative to the readout resonator frequency in order to facilitate qubit reset. For example, the frequency controller 116 may be configured to put the frequency at which the qubit 112 operates at or near the resonator frequency. In some implementations the frequency controller may apply adiabatic swapping to adjust the frequency at which the qubit 112 operates relative to the frequency at which the readout resonator 114 operates in order to facilitate qubit reset. Performing qubit multi-state reset using a frequency controller is described in more detail below with reference to FIG. 6. The frequency controller 116 may also be configured to control the frequency of the qubit 112 such that during a computational operation the qubit operates at a qubit operating frequency in the frequency spectrum.

Figure 1C:
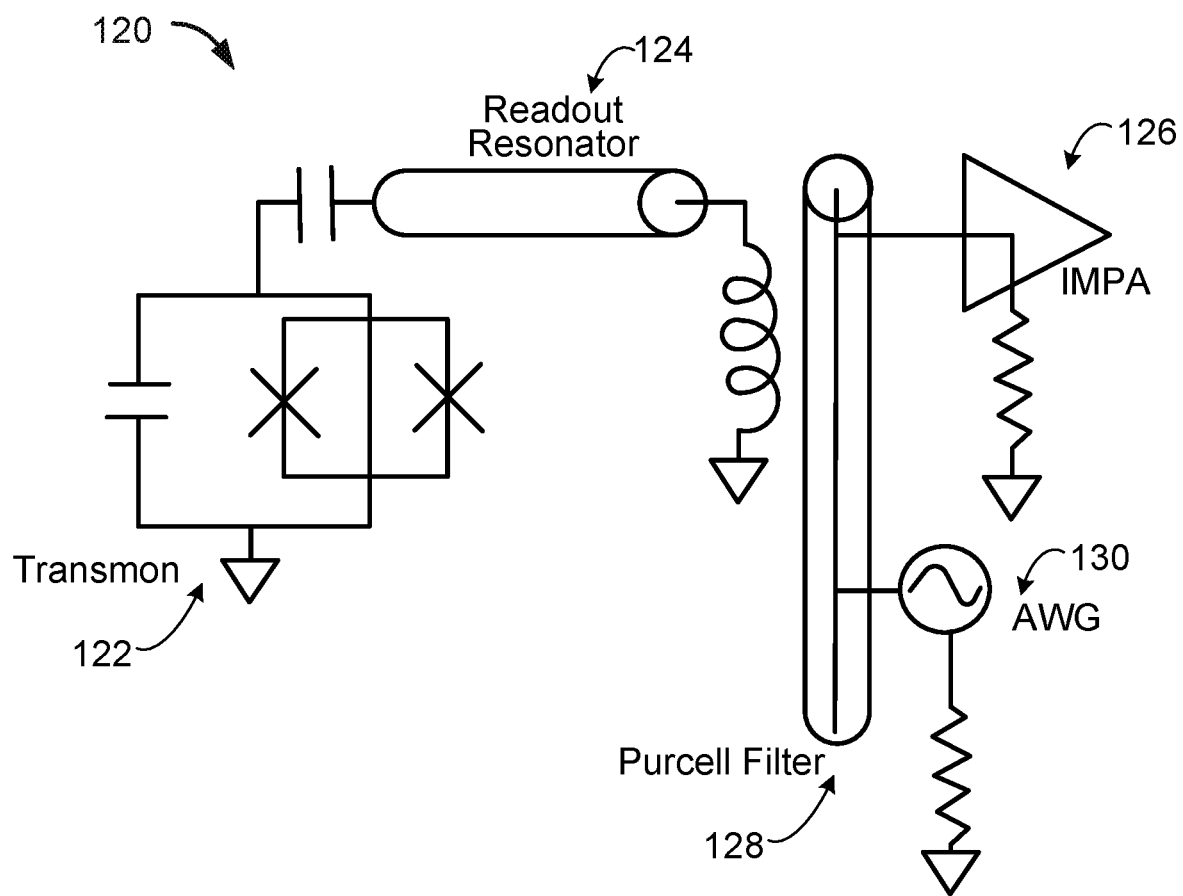
FIG. 1C depicts an example circuit diagram for performing quantum bit multi-state reset.

FIG. 1C depicts a diagram 120 of an example circuit for performing qubit multi-state reset. For example, the example circuit diagram 120 may realize the example systems 100 and 110 described above with reference to FIGS. 1A and 1B, respectively.

The diagram 120 includes a qubit 122, e.g., a transmon qubit. The qubit 122 may be capacitively coupled to a resonator 124. The resonator 124 may be inductively coupled to a bandpass Purcell filter 128, e.g., with Q≈30. The resonator 124 may be driven by an arbitrary waveform generator (AWG) 130 connected to the filter 128. Dispersed photons may be measured by a low noise, impedance matched parametric amplifier (IMPA) 126 that may also be connected to the filter 128.

Figure 1D:
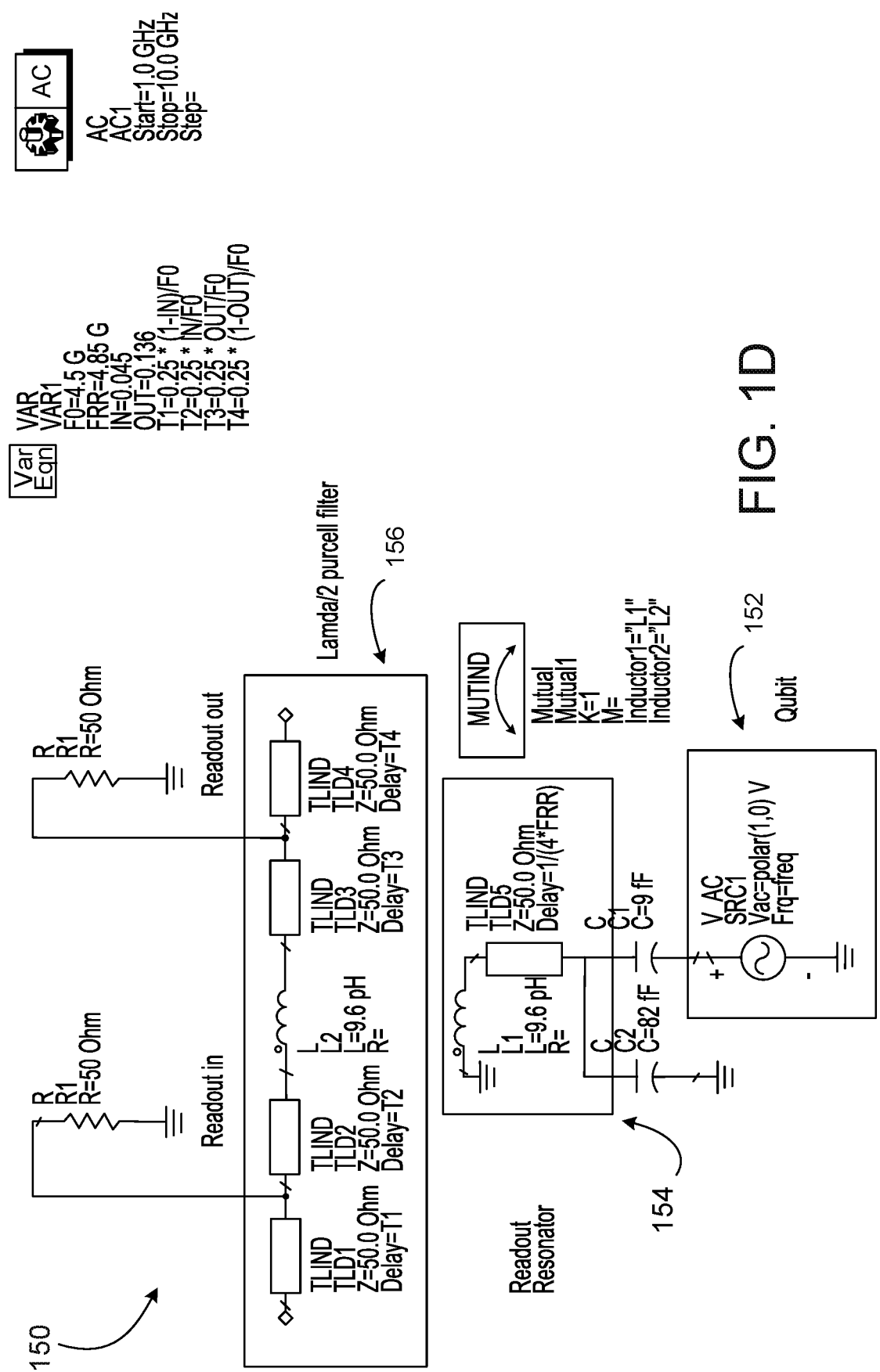
FIG. 1D depicts an example circuit diagram for performing quantum bit multi-state reset using a low frequency readout resonator.

FIG. 1D depicts a diagram 150 of an example circuit for performing qubit multi-state reset using a low frequency readout resonator. For example, the example circuit diagram 150 may realize the example system 110 described above with reference to FIG. 1B.

The example circuit diagram 150 includes a qubit 152. The qubit 152 may be coupled to a resonator 154, e.g., through capacitive coupling. The resonator 154 may be coupled to a Purcell filter 156, e.g., through inductive coupling. In some implementations the Purcell filter may be a lambda/2 Purcell filter. For illustrative purposes only, the diagram 150 includes example values of circuit parameters. In some implementations, values of circuit parameters that are different to those shown in FIG. 1D may be used.

Figure 2:
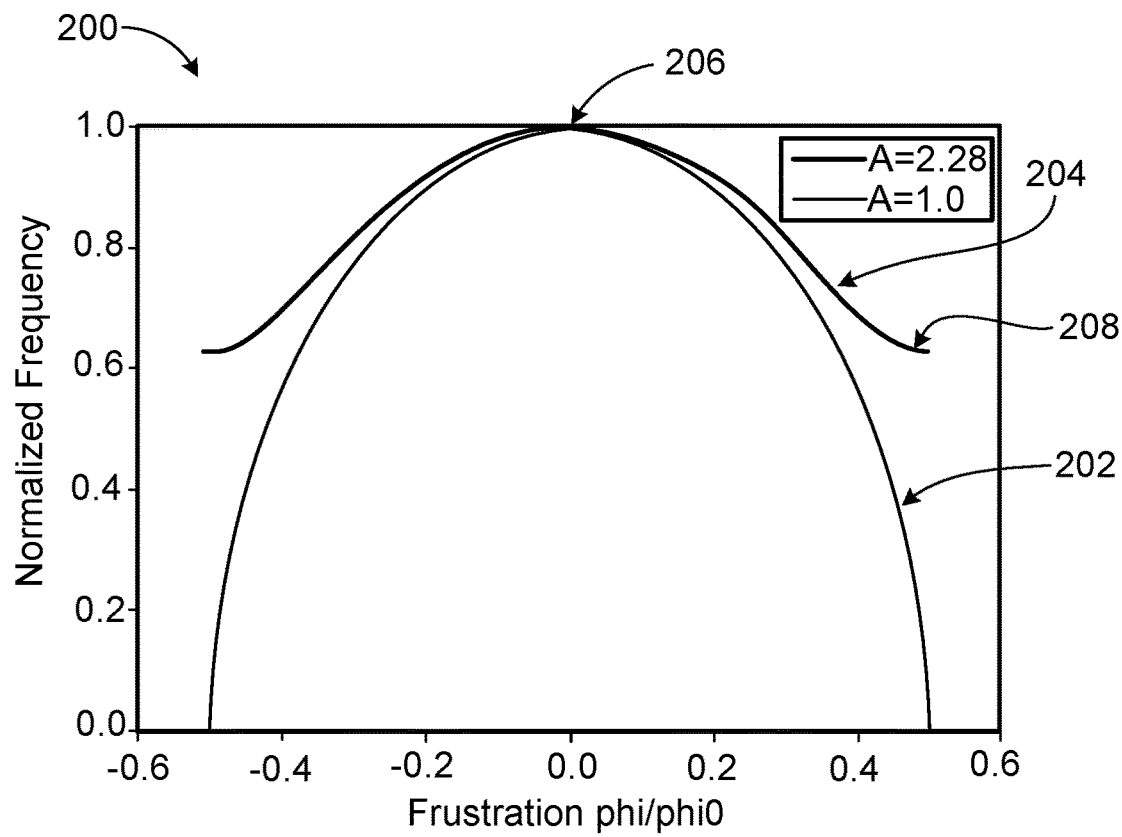
FIG. 2 is an illustration of frequency versus flux for symmetric and asymmetric SQUIDs.

FIG. 2 is an illustration 200 of frequency versus flux for qubits realized by superconducting quantum interference devices (SQUIDs), as described above with reference to FIG. 1A. The x-axis of illustration 200 represents magnetic flux $\Phi/\Phi_0$ applied to a qubit. The y-axis of illustration 200 represents normalized frequency at which the qubit operates. The illustration 200 shows two different example plots, i.e., plots 202 and 204, of qubit frequency versus magnetic flux.

Example plot 202 illustrates qubit frequency versus magnetic flux for a symmetric SQUID, e.g., a SQUID whose asymmetry factor A=1.0. The plot 202 shows that a qubit realized by a symmetric SQUID includes one flux-insensitive point or region, e.g., point 206 corresponding to zero magnetic flux.

Example plot 204 illustrates qubit frequency versus magnetic flux for an asymmetric SQUID, e.g., a SQUID whose asymmetry factor A=2.28. The plot 204 shows that a qubit realized by an asymmetric SQUID includes two flux-insensitive points or regions, e.g., point 206 corresponding to zero magnetic flux and point 208 corresponding to magnetic flux equal to 0.5.

Figure 3:
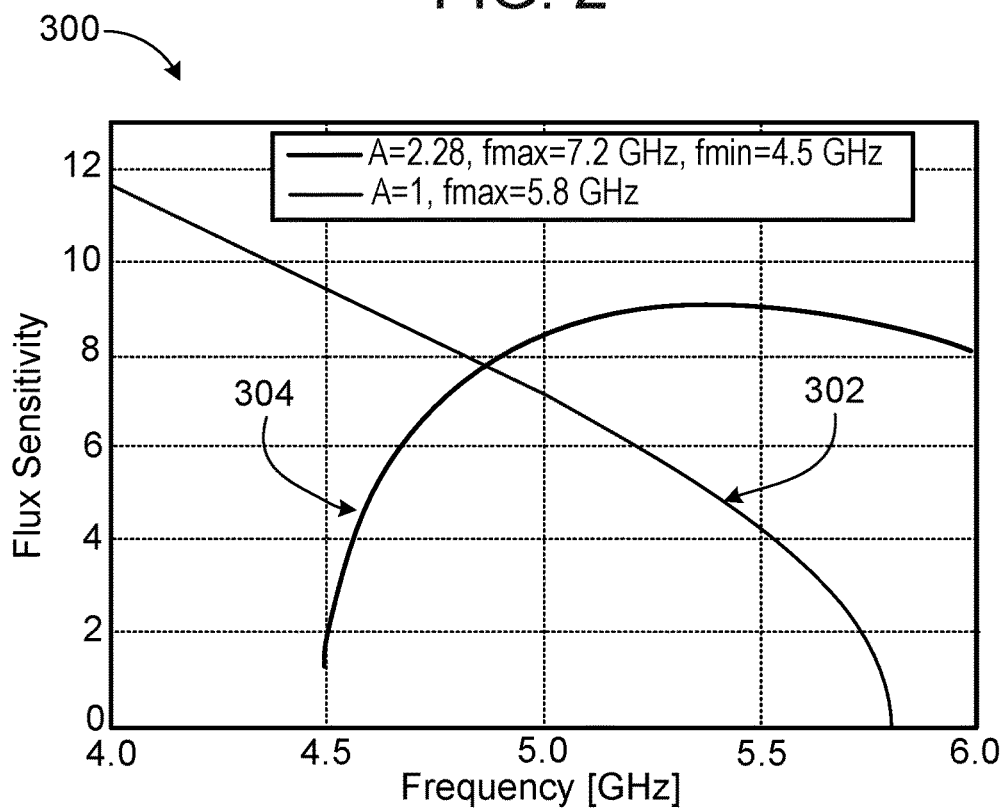
FIG. 3 is an illustration of the flux sensitivity of symmetric and asymmetric SQUIDs.

FIG. 3 is an illustration 300 of flux sensitivity for qubits realized by superconducting quantum interference devices (SQUIDs), as described above with reference to FIG. 1A. The x-axis of illustration 300 represents frequency in GHz at which the qubit operates. The y-axis of illustration 300 represents flux sensitivity of the qubit. The illustration 300 shows two different example plots, i.e., plots 302 and 304, of qubit flux sensitivity.

Example plot 302 illustrates flux sensitivity for qubits realized by a symmetric SQUID, e.g., a SQUID whose asymmetry factor A=1.0. The plot 302 shows that the frequency region 5.8-5.3 GHz provides flux sensitivity <6.0.

Example plot 304 illustrates flux-insensitivity for qubits realized by an asymmetric SQUID, e.g., a SQUID whose asymmetry factor A=2.28.

Figure 4A:
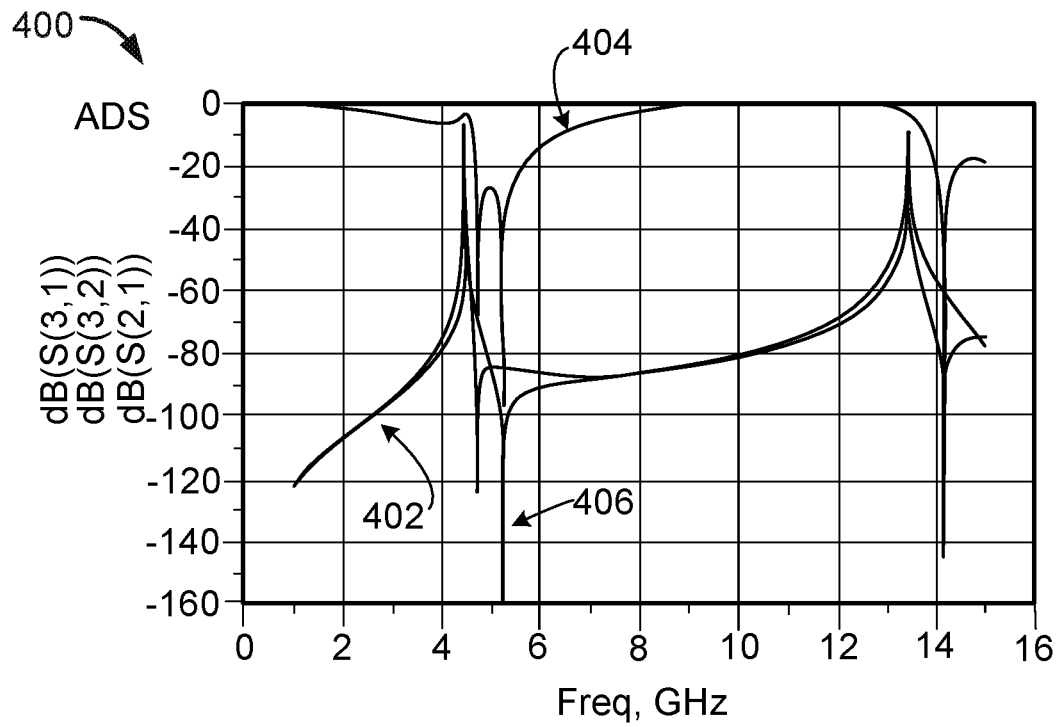
FIG. 4A is an illustration showing the coupling of a qubit to an environment including a low frequency resonator via S-parameters.

FIG. 4A is an example illustration 400 showing the coupling of a qubit to an environment including a low frequency resonator via S-parameters (scattering parameters). For example, the qubit may be coupled to an environment including a readout resonator and Purcell filter, as described above with reference to FIGS. 1B and 1D.

The example illustration 400 includes an x-axis representing qubit frequency in GHz, and a y-axis representing decibels. The illustration plots a transition from a third qubit level to a first qubit level 402. The illustration further plots a transition from a third qubit level to a second qubit level 404. The illustration further plots a transition from a second qubit level to a first qubit level 406. Each of the plots 402, 404 and 406 show a low signal strength when the qubit frequency is between 4 GHz and 6 GHz, i.e., at a qubit operating frequency. The illustration shows that the qubit is well protected from the environment, e.g., that the qubit does not couple to higher modes of the readout resonator.

Figure 4B:
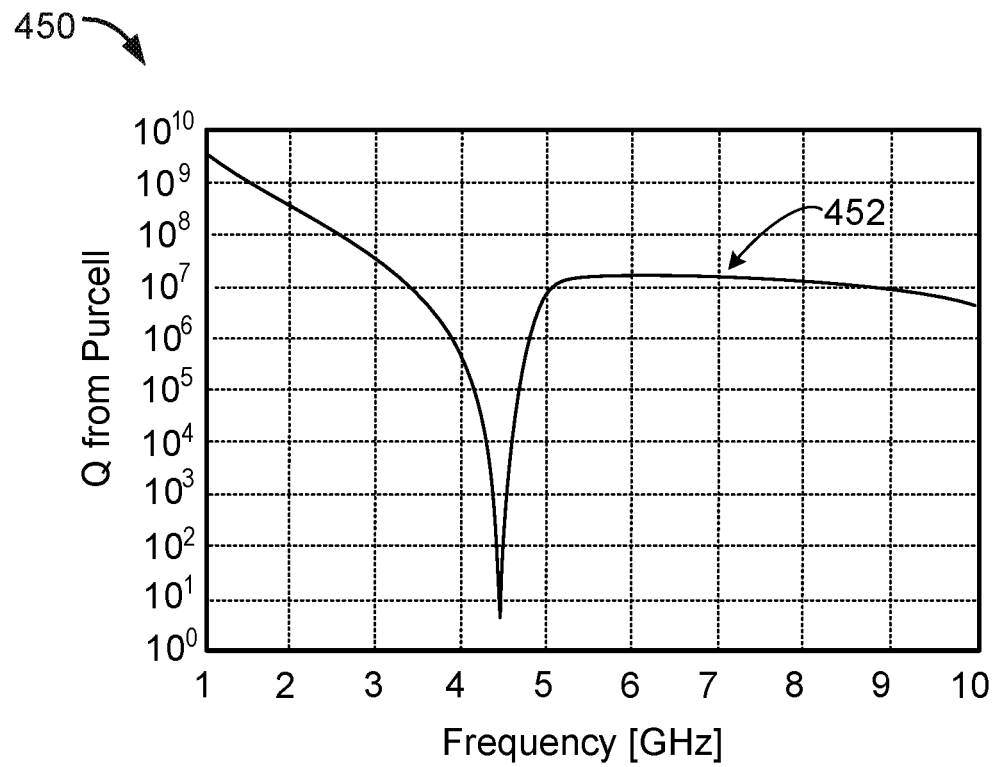
FIG. 4B is an illustration showing the quality rate of a qubit coupled to an environment including a low frequency resonator.

FIG. 4B is an example illustration 450 showing the quality value of a qubit coupled to an environment including a low frequency resonator. For example, the qubit may be coupled to an environment including a readout resonator and Purcell filter, as described above with reference to FIGS. 1B and 1D.

The example illustration 450 includes an x-axis representing qubit frequency, and a y-axis representing a quality value (Q-value) for the qubit. The example illustration 450 shows that the Q-value reaches a target value of 10^7 faster on the higher qubit frequency side than the lower qubit frequency side—thus illustrating that the low frequency resonator system, e.g., that described above with reference to FIGS. 1B and 1D, functions comparably, if not better, than a high frequency resonator system, i.e., a system including a readout resonator whose operating frequency is higher than the qubit operating frequency.

Programming the Hardware

Figure 5:
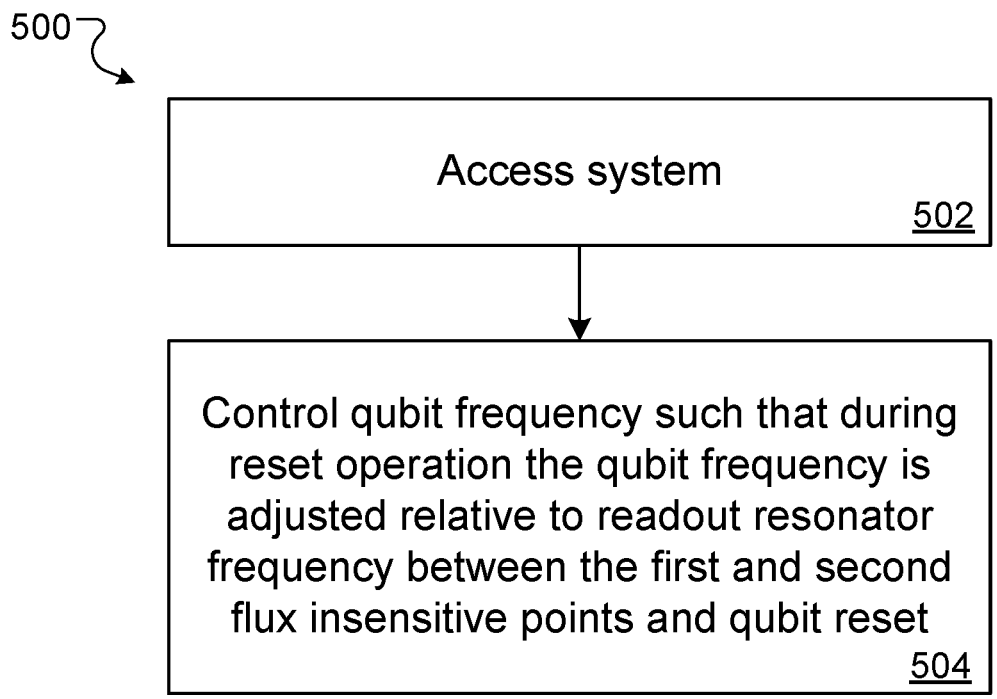
FIG. 5 is a flowchart of an example process for performing qubit multi-state reset using an asymmetric junction scheme.

FIG. 5 is a flowchart of an example process for performing qubit multi-state reset using an asymmetric junction scheme. For example, the process 500 may be performed by the frequency controller 106 of system 100 described above with reference to FIG. 1A. For convenience, the process 500 is described as resetting a single qubit. However, the process 500 may be performed in parallel for systems that include multiple qubits.

The system accesses a quantum system (step 502). The quantum system may include a qubit and a readout resonator, e.g., qubit 102 and readout resonator 104 described above with reference to FIG. 1A. The qubit operates over a qubit frequency spectrum with a first flux-insensitive point and a second flux-insensitive point. The readout resonator operates at a readout resonator frequency in-between the first flux insensitive point and the second flux-insensitive point. In some implementations the readout resonator frequency may be at least a predetermined distance away from both the first flux-insensitive point and the second flux-insensitive point.

As described above with reference to FIG. 1A, in some implementations the qubit may be realized by an asymmetric superconducting quantum interference device (SQUID). The location of the first flux-insensitive point and the second flux-insensitive point in the qubit frequency spectrum may depend on an asymmetry factor of the SQUID. For example, in some implementations the ratio of the frequency of the first flux-insensitive point to the frequency of the second flux-insensitive point depends on the asymmetry factor of the SQUID. The asymmetry factor of the SQUID may be given by equation (3) below.

$$A = \frac{1+R^2}{1-R^2}, R = \frac{\sqrt{A-1}}{\sqrt{A+1}} \quad (3)$$

In equation (3), A represents the asymmetry factor, R represents the ratio of the frequency of the first flux-insensitive point to the frequency of the second flux-insensitive point and $A>1$, $R<1$.

The system controls the frequency of the qubit such that during a reset operation the frequency of the qubit is adjusted relative to the readout resonator and the qubit is reset (step 504). In some implementations the system may adjust the qubit frequency relative to the readout resonator frequency by putting the qubit frequency at or near the resonator frequency. For example, the system may apply adiabatic swapping to adjust the frequency of the qubit relative to the readout resonator frequency such that the qubit is reset.

As described above with reference to FIG. 1A, the qubit may be active in or provided for use in a quantum computation. In such settings steps 502 and 504 may be repeatedly performed during the quantum computation, e.g., immediately after a measurement operation associated with a computation operation in the quantum computation.

Figure 6:
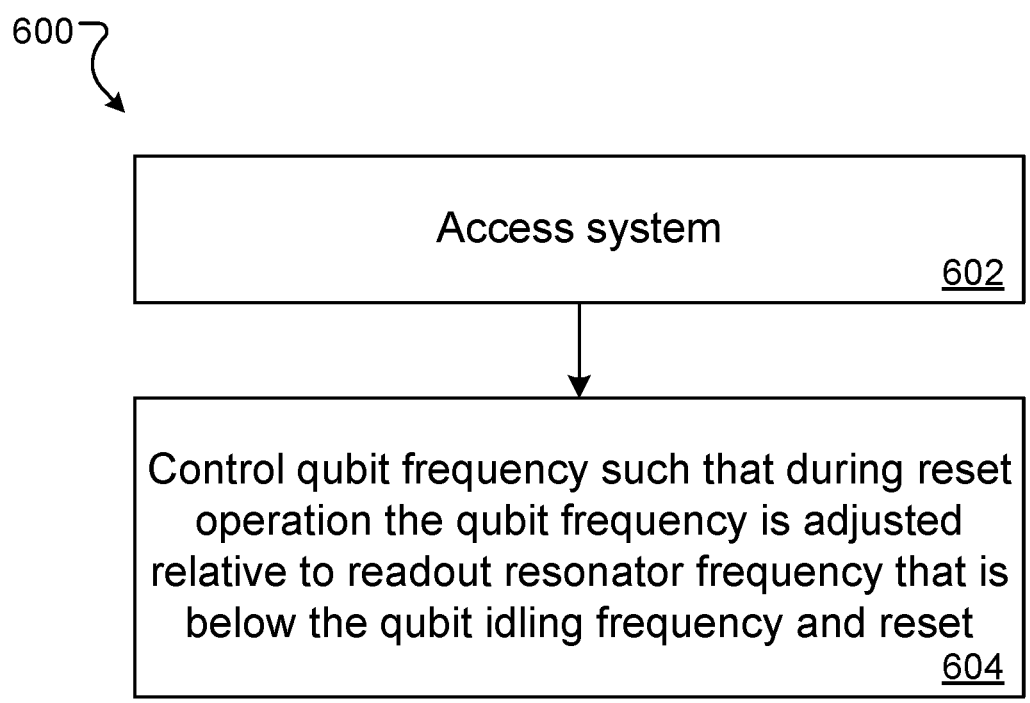
FIG. 6 is a flowchart of an example process for performing qubit multi-state reset using a low frequency readout resonator scheme.

FIG. 6 is a flowchart of an example process for performing qubit multi-state reset using an asymmetric junction scheme. For example, the process 600 may be performed by the frequency controller 116 of system 110 described above with reference to FIG. 1B. For convenience, the process 600 is described as resetting a single qubit. However, the process 600 may be performed in parallel for systems that include multiple qubits.

The system accesses a quantum system (step 602). The quantum system may include a qubit and a readout resonator, e.g., qubit 112 and readout resonator 114 described above with reference to FIG. 1B. The qubit operates at a qubit operating frequency over a frequency spectrum. As described above with reference to FIG. 1B, in some implementations the qubit may be a superconducting qubit, e.g., as realized by a superconducting quantum interference device (SQUID). The readout resonator operates at a readout resonator frequency below the qubit operating frequency. In some implementations the quantum system further includes a Purcell filter centered around a Purcell filter frequency that is also below the qubit operating frequency.

The system controls the frequency of the qubit such that during a reset operation the frequency of the qubit is adjusted relative to the readout resonator frequency such that the qubit is reset (step 604). In some implementations the system may adjust the qubit frequency relative to the readout resonator frequency by putting the qubit frequency at or near the resonator frequency. For example, the system may apply adiabatic swapping to adjust the frequency of the qubit relative to the readout resonator frequency such that the qubit is reset.

As described above with reference to FIG. 1A, the qubit may be active in or provided for use in a quantum computation. In such settings steps 602 and 604 may be repeatedly performed during the quantum computation, e.g., immediately after a measurement operation associated with a computation operation in the quantum computation.

Embodiments of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Embodiments of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof both.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. An apparatus, comprising:
a qubit, wherein the qubit operates over a qubit frequency spectrum with a first flux-insensitive point and a second flux-insensitive point;
a readout resonator, wherein the readout resonator operates at a readout resonator frequency in-between the first flux insensitive point and the second flux-insensitive point;
a frequency controller configured to control the frequency of the qubit such that during a quantum computation the frequency of the qubit is adjusted relative to the readout resonator frequency.

2. The apparatus of claim 1, wherein during the quantum computation the frequency of the qubit is adjusted relative to the readout resonator frequency to perform a downward qubit level transition.

3. The apparatus of claim 1, wherein the frequency controller is further configured to control the frequency of the qubit such that during the quantum computation the qubit operates at the first flux-insensitive point or the second flux-insensitive point.

4. The apparatus of claim 1, wherein the qubit comprises an asymmetric superconducting quantum interference device (SQUID), and wherein the location of the first flux-insensitive point and the second flux-insensitive point in the qubit frequency spectrum depend on an asymmetry factor of the SQUID.

5. The apparatus of claim 4, wherein the ratio of the frequency of the first flux-insensitive point to the frequency of the second flux-insensitive point depends on the asymmetry factor of the SQUID.

6. The apparatus of claim 5, wherein the asymmetry factor of the SQUID is given by $$A = \frac{1+R^2}{1-R^2}, R = \frac{\sqrt{A-1}}{\sqrt{A+1}}$$

where A represents the asymmetry factor, R represents the ratio of the frequency of the first flux-insensitive point to the frequency of the second flux-insensitive point and A>1, R<1.

7. The apparatus of claim 1, wherein to adjust the qubit frequency relative to the readout resonator frequency the frequency controller is configured to set the qubit frequency at or near the resonator frequency.

8. The apparatus of claim 1, wherein during the quantum computation the frequency controller is configured to apply adiabatic swapping to adjust the frequency of the qubit relative to the readout resonator frequency.

9. The apparatus of claim 1, wherein the first flux-insensitive point is lower than the second flux-insensitive point, and wherein during the quantum computation the qubit operates at the lower flux-insensitive point.

10. The apparatus of claim 1, wherein the readout resonator frequency is at least a predetermined distance away from both the first flux-insensitive point and the second flux-insensitive point.

11. The apparatus of claim 1, wherein the qubit is an Xmon qubit.

12. The apparatus of claim 1, wherein the readout resonator operates at about 6.65 GHz.

13. The apparatus of claim 12, wherein the first flux-insensitive point is at about 4.5 GHz and the second flux-insensitive point is at about 7.2 GHz.

14. A method for operating a qubit, the method comprising:
accessing an apparatus comprising:
a qubit, wherein the qubit operates over a qubit frequency spectrum with a first flux-insensitive point and a second flux-insensitive point;
a readout resonator, wherein the readout resonator operates at a readout resonator frequency in-between the first flux insensitive point and the second flux-insensitive point;
a frequency controller configured to control the frequency of the qubit such that during a quantum computation the frequency of the qubit is adjusted relative to the readout resonator frequency; and
controlling the frequency of the qubit such that during a quantum computation the frequency of the qubit is adjusted relative to the readout resonator.

15. The method of claim 14, wherein during the quantum computation the frequency of the qubit is adjusted relative to the readout resonator frequency to perform a downward qubit level transition.

16. The method of claim 14, further comprising controlling the frequency of the qubit such that during the quantum computation the qubit operates at the first flux-insensitive point or the second flux-insensitive point.

17. The method of claim 14, wherein the qubit comprises an asymmetric superconducting quantum interference device (SQUID), and wherein the location of the first flux-insensitive point and the second flux-insensitive point in the qubit frequency spectrum depends on an asymmetry factor of the SQUID.

18. The method of claim 17, wherein the ratio of the frequency of the first flux-insensitive point to the frequency of the second flux-insensitive point depends on the asymmetry factor of the SQUID.

19. The method of claim 18, wherein the asymmetry factor of the SQUID is given by $$A = \frac{1+R^2}{1-R^2}, R = \frac{\sqrt{A-1}}{\sqrt{A+1}}$$

where A represents the asymmetry factor, R represents the ratio of the frequency of the first flux-insensitive point to the frequency of the second flux-insensitive point and A>1, R<1.

20. The method of claim 14, wherein controlling the frequency of the qubit such that during a quantum computation the frequency of the qubit is adjusted relative to the readout resonator comprises putting the qubit frequency at or near the resonator frequency.

21. The method of claim 14, wherein controlling the frequency of the qubit such that during quantum computation the frequency of the qubit is adjusted relative to the readout resonator comprises applying adiabatic swapping to adjust the frequency of the qubit relative to the readout resonator frequency.

22. The method of claim 14, wherein the first flux-insensitive point is lower than the second flux-insensitive point, and wherein during the quantum computation the qubit operates at the lower flux-insensitive point.

23. The method of claim 14, wherein the readout resonator frequency is at least a predetermined distance away from both the first flux-insensitive point and the second flux-insensitive point.

24. An apparatus, comprising:
a qubit, wherein the qubit operates at a qubit frequency over a qubit frequency spectrum;
a readout resonator, wherein the readout resonator operates at a readout resonator frequency below the qubit frequency; and
a frequency controller configured to control the frequency of the qubit such that during a quantum computation the frequency of the qubit is adjusted relative to the readout resonator frequency.

25. The apparatus of claim 24, wherein during the quantum computation the frequency of the qubit is adjusted relative to the readout resonator frequency to perform a downward qubit level transition.

26. The apparatus of claim 24, further comprising a Purcell filter, wherein the Purcell filter is centered around a Purcell filter frequency.

27. The apparatus of claim 26, wherein the Purcell filter frequency is lower than the qubit operating frequency.

28. The apparatus of claim 27, wherein the Purcell filter frequency is about 4.5 GHz.

29. The apparatus of claim 24, wherein the qubit frequency spectrum comprises frequencies between about 4.5 and 6.5 GHz.

30. The apparatus of claim 24, wherein the readout resonator operates at about 1 GHz below the qubit operating frequency.

31. The apparatus of claim 24, wherein the qubit comprises a superconducting qubit.

32. The apparatus of claim 24, wherein to adjust the qubit frequency relative to the readout resonator frequency the frequency controller is configured to set the qubit frequency at or near the resonator frequency.

33. The apparatus of claim 24, wherein during the quantum computation the frequency controller is configured to apply adiabatic swapping to adjust the frequency of the qubit relative to the readout resonator frequency.

34. A method for operating a qubit, the method comprising:
accessing an apparatus comprising:
a qubit, wherein the qubit operates at a qubit operating frequency over a qubit frequency spectrum;
a readout resonator, wherein the readout resonator operates at a readout resonator frequency below the qubit operating frequency; and
a frequency controller that controls the frequency of the qubit such that during a quantum computation the frequency of the qubit is adjusted relative to the readout resonator frequency; and
controlling the frequency of the qubit such that during a quantum computation the frequency of the qubit is adjusted relative to the readout resonator.

35. The method of claim 34, wherein during the quantum computation the frequency of the qubit is adjusted relative to the readout resonator frequency to perform a downward qubit level transition.

36. The method of claim 34, wherein the apparatus further comprises a Purcell filter, wherein the Purcell filter is centered around a Purcell filter frequency.

37. The method of claim 36, wherein the Purcell filter frequency is lower than the qubit operating frequency.

38. The method of claim 34, wherein adjusting the qubit frequency relative to the readout resonator frequency comprises setting the qubit frequency at or near the resonator frequency.

39. The method of claim 34, wherein during the quantum computation the frequency controller applies adiabatic swapping to adjust the frequency of the qubit relative to the readout resonator frequency.

* * * * *